United States Patent
Stoeldraijer et al.

(10) Patent No.: US 7,903,234 B2
(45) Date of Patent: Mar. 8, 2011

(54) LITHOGRAPHIC APPARATUS, DEVICE MANUFACTURING METHOD AND COMPUTER PROGRAM PRODUCT

(75) Inventors: Judocus Marie Dominicus Stoeldraijer, Bladel (NL); Erik Roelof Loopstra, Heeze (NL); Heine Melle Mulder, Veldhoven (NL); Timotheus Franciscus Sengers, 's-Hertogenbosch (NL); Freerk Adriaan Stoffels, Veldhoven (NL); Laurentius Catrinus Jorritsma, Helmond (NL); Reiner Maria Jungblut, Eindhoven (NL)

(73) Assignee: ASML Netherlands B.V. (NL)

( * ) Notice: Subject to any disclaimer, the term of this patent is extended or adjusted under 35 U.S.C. 154(b) by 598 days.

(21) Appl. No.: 11/984,837

(22) Filed: Nov. 21, 2007

(65) Prior Publication Data

US 2008/0158528 A1 Jul. 3, 2008

Related U.S. Application Data

(60) Provisional application No. 60/999,776, filed on Nov. 27, 2006, provisional application No. 60/999,775, filed on May 14, 2007.

(51) Int. Cl.
*G03B 27/54* (2006.01)
*G03B 27/52* (2006.01)

(52) U.S. Cl. .......................... 355/67; 355/30

(58) Field of Classification Search .................. 355/30, 355/52, 53, 55, 67; 250/492.2, 548
See application file for complete search history.

(56) References Cited

U.S. PATENT DOCUMENTS

| | | | |
|---|---|---|---|
| 6,031,946 A | 2/2000 | Bergmann et al. | 355/18 |
| 6,504,597 B2 | 1/2003 | Schuster et al. | 355/67 |
| 6,538,722 B2 * | 3/2003 | Matsumoto et al. | 355/53 |
| 6,603,530 B1 | 8/2003 | Kohno | 355/53 |
| 6,642,994 B2 * | 11/2003 | Mori et al. | 355/53 |
| 6,930,754 B1 | 8/2005 | Sugita et al. | |
| 6,980,278 B2 * | 12/2005 | Aoyama et al. | 355/53 |
| 7,319,507 B2 * | 1/2008 | Yonekawa et al. | 355/53 |
| 2004/0021845 A1 | 2/2004 | Kawahara | |
| 2004/0108467 A1 | 6/2004 | Eurlings et al. | 250/492.1 |
| 2007/0013888 A1 | 1/2007 | Flagello et al. | 355/67 |

FOREIGN PATENT DOCUMENTS

| | | |
|---|---|---|
| EP | 0 949 541 A2 | 10/1999 |
| EP | 1 109 067 A2 | 6/2001 |
| EP | 0 949 541 A3 | 9/2001 |
| EP | 1 109 067 A3 | 6/2003 |
| EP | 1 367 446 A1 | 12/2003 |

(Continued)

OTHER PUBLICATIONS

English Language Abstract for Japanese Patent Publication No. JP 10-079337 A, Japanese Patent Office, Patent & Utility Model Gazette DB, 1 page (1998).

(Continued)

*Primary Examiner* — Hung Henry Nguyen
(74) *Attorney, Agent, or Firm* — Sterne, Kessler, Goldstein & Fox P.L.L.C.

(57) ABSTRACT

In a lithographic apparatus, a corrective irradiation procedure is performed using an illumination mode arranged so as to heat a selected part of an element of the projection system near a pupil plane thereof that is relatively unheated during production exposure. The corrective irradiation procedure aims to improve uniformity of optical element heating of the projective system and/or to reduce a phase gradient.

14 Claims, 3 Drawing Sheets

FOREIGN PATENT DOCUMENTS

| | | |
|---|---|---|
| JP | 08-221261 | 8/1996 |
| JP | 10-064790 | 3/1998 |
| JP | 10-079337 A | 3/1998 |
| JP | 2000-021722 A | 1/2000 |
| JP | 2001-250761 A | 9/2001 |
| JP | 2002-057081 A | 2/2002 |
| JP | 2004-063988 A | 2/2004 |
| JP | 2005-311020 A | 11/2005 |
| WO | WO 2004/051716 A1 | 6/2004 |
| WO | WO 2006/025408 A1 | 3/2006 |

OTHER PUBLICATIONS

English Language Abstract for Japanese Patent Publication No. JP 2000-021722 A, Japanese Patent Office, Patent & Utility Model Gazette DB, 1 page (2000).

English Language Abstract for Japanese Patent Publication No. JP 2001-250761 A, Japanese Patent Office, Patent & Utility Model Gazette DB, 1 page (2001).

English Language Abstract for Japanese Patent Publication No. JP 2002-057081 A, Japanese Patent Office, Patent & Utility Model Gazette DB, 1 page (2002).

English Language Abstract for Japanese Patent Publication No. JP 2004-063988 A, Japanese Patent Office, Patent & Utility Model Gazette DB, 1 page (2004).

English Language Abstract for Japanese Patent Publication No. JP 2005-311020 A, Japanese Patent Office, Patent & Utility Model Gazette DB, 1 page (2005).

English Language Abstract for WIPO Patent Publication No. WO 2006/025408 Al, European Patent Office, espacenet database—Worldwide, 1 page (2006).

English translation of Notice of Reasons For Rejection directed to related Japanese Patent Application No. JP 2007-300017, mailed on Oct. 27, 2010 from the Japan Patent Office; 3 pages.

* cited by examiner

LITHOGRAPHIC APPARATUS, DEVICE MANUFACTURING METHOD AND COMPUTER PROGRAM PRODUCT

CROSS-REFERENCE TO RELATED APPLICATIONS

This application claims priority to and benefit from co-pending U.S. Provisional Patent Application Nos. 60/999,776, filed Nov. 27, 2006, and 60/999,775, filed May 14, 2007, the entire contents of which are hereby incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

It is well-known in the art of lithography that the image of a mask pattern can be improved, and process windows enlarged, by appropriate choice of the angles at which the mask pattern is illuminated. In an apparatus having a Koehler illumination arrangement, the angular distribution of light illuminating the mask is determined by the intensity distribution in a pupil plane of the illumination system, which can be regarded as a secondary source. Illumination modes are commonly described by reference to the shape of the intensity distribution in the pupil plane. Conventional illumination, i.e. even illumination from all angles from 0 to a certain maximum angle, requires a uniform disk-shaped intensity distribution in the pupil plane. Other commonly-used intensity distributions are: annular, in which the intensity distribution in the pupil plane is in the shape of an annulus; dipole illumination, in which there are two poles in the pupil plane; and quadrupole illumination, in which there are four poles in the pupil plane. To create these illumination schemes, various methods have been proposed. For example, a zoom-axicon, that is a combination of a zoom lens and an axicon, can be used to create annular illumination with controllable inner and outer radii ($\sigma_{inner}$ and $\sigma_{outer}$) of the annulus. To create dipole and quadrupole type illumination modes, it has been proposed to use spatial filters, that is opaque plates with apertures where the poles are desired as well as arrangements using moveable bundles of optical fibers. Using spatial filters may be undesirable because the resulting loss of light reduces the throughput of the apparatus and hence increases its cost of ownership. Arrangements with bundles of optical fibers may be complex and inflexible. It has therefore been proposed to use a diffractive optical element (DOE) to form the desired intensity distribution in the pupil plane. The diffractive optical elements are made by etching different patterns into different parts of the surface of a quartz or $CaF_2$ substrate.

The choice of materials from which lenses useable with deep ultraviolet radiation (DUV), e.g. at 248 nm, 193 nm, 157 nm or 126 nm, can be made is quite limited and even the best materials have significant coefficients of absorption of this radiation. This means that the lenses in the projection system absorb energy during exposures and heat up, leading to changes in their shape, separation and refractive index which introduce aberrations into the projected image. Therefore, many lens systems are provided with one or more actuated lens elements whose shape, position and/or orientation in one or more degrees of freedom can be adjusted during or between exposures to compensate for lens heating effects.

If an illumination mode, such as dipole, in which the energy of the beam is strongly localized in a pupil plane of the illumination system is used, then the energy of the beam will also be strongly localized in and near the pupil plane(s) of the projection system. Lens heating effects are more severe when such localized illumination modes are used because the temperature gradients in the lens elements affected are greater, leading to localized changes in shape and/or refractive index which cause large phase gradients in the beam. These effects are often not correctable by existing actuated lens elements, which generally effect corrections described by only lower order Zernike polynomials e.g. up to Z5 or Z6. Similar effects can be caused by the use of a slit-shaped illumination field, as is common in a scanning lithographic apparatus, but these effects are generally of lower order, and more easily correctable.

Past attempts to deal with the problem of non-uniform lens heating include the provision of additional light sources, e.g. infra-red, to heat the "cold" part, i.e. the part not traversed by the intense part of the beam, of elements of the projection system. See, e.g., Japanese patent application publication JP-A-08-221261, which addresses non-uniform heating caused by zonal or modified illumination. The provision of such additional light sources and guides to conduct the additional heat radiation to the correct place increases the complexity of the apparatus and the increased heat load in the projection system necessitates the provision of a cooling system of higher capacity.

Another proposal to deal with non-uniform heating caused by a slit-shaped illumination field is disclosed in U.S. Pat. No. 6,603,530, which describes a special "lens illumination mark" provided in the reticle stage outside of the reticle area which diverges radiation so that the illumination of the lens elements in the projection system is rotationally symmetric. The lens elements are thermally saturated by illumination through the special mark before production exposures so that the non-rotationally symmetric heating caused by a slit-shaped illumination system does not cause non-rotationally symmetric aberrations.

The problem of non-uniform lens heating caused by localized illumination modes is addressed in WO 2004/051716. In one proposal described in this document, "dummy irradiation" is performed during wafer exchange to heat the cold parts of the lens elements affected by non-uniform heating in production exposures. During the dummy irradiation, the illumination mode is set, using a diffractive optical element or an adjustable diaphragm, to be the inverse of the illumination mode used for production exposures so that the heating effects of the dummy irradiation are the inverse of the heating effects of production exposures and the net heating is more uniform. Another proposal of this document is to use additional infra-red radiation to locally heat selected lens elements.

SUMMARY

It is desirable, for example, to provide an improved method for at least reducing or mitigating for the effects of non-uniform heating of elements of a projection system when using a localized illumination mode.

According to an aspect of the invention, there is provided a lithographic apparatus comprising: an illumination system configured to condition a radiation beam so as to illuminate a patterning device in a first or a second illumination mode selectively; a support structure constructed to support the patterning device, the patterning device configured to impart the radiation beam with a pattern in its cross-section to form a patterned beam; a substrate table constructed to hold a substrate; a projection system configured to project the patterned beam onto a target portion of the substrate, the projection system comprising a plurality of optical elements and having a pupil plane, at least one of the optical elements being located in or near the pupil plane; and a control system configured to control the illumination system, the support structure and the substrate table to select the first illumination mode when a pattern on the patterning device and a substrate on the substrate table are in the path of the radiation beam to perform a production exposure and to select the second illumination mode during a time that no substrate is in the path of the radiation beam to perform a corrective irradiation process, wherein, in use of the apparatus, an angular distribution of radiation at the patterning device is such that an intensity of the patterned beam is substantially contained within a first part of the cross-sectional area of the at least one optical element in the first illumination mode and within a second part of the cross-sectional area of the at least one optical element in the second illumination mode, the first and second parts being substantially non-overlapping and the combination of the first and second parts not encompassing the entire cross-sectional area of the at least one optical element.

According to an aspect of the invention, there is provided a device manufacturing method comprising: projecting a patterned beam of radiation having a wavelength onto a substrate using a projection system having a pupil plane and comprising a plurality of optical elements, at least one of the optical elements being located in or near the pupil plane; and irradiating the projection system with a corrective beam of radiation having substantially the same wavelength as the patterned beam, wherein an intensity of the patterned beam is substantially contained within a first part of the cross-sectional area of the at least one optical element and an intensity of the corrective beam is substantially contained within a second part of the cross-sectional area of the at least one optical element, the first and second parts being substantially non-overlapping and a combination of the first and second parts not encompassing the entire cross-sectional area of the at least one optical element.

According to an aspect of the invention, there is provided a computer program product comprising instructions recorded on a computer-readable medium, the instructions being such as to control a lithographic apparatus, having a projection system having a pupil plane and a plurality of optical elements, at least one of the optical elements being located in or near the pupil plane, to perform a device manufacturing method, the method comprising: projecting a patterned beam of radiation having a wavelength onto a substrate using the projection system; and irradiating the projection system with a corrective beam of radiation having substantially the same wavelength as the patterned beam, wherein an intensity of the patterned beam is substantially contained within a first part of the cross-sectional area of the at least one optical element and an intensity of the corrective beam is substantially contained within a second part of the cross-sectional area of the at least one optical element, the first and second parts being substantially non-overlapping and a combination of the first and second parts not encompassing the entire cross-sectional area of the at least one optical element.

According to an aspect of the invention, there is provided a lithographic apparatus that includes an illumination system configured to condition a radiation beam so as to illuminate a patterning device in a first or a second illumination mode selectively. The illumination system includes a first diffractive optical element in the path of the radiation beam. The first diffractive optical element is arranged to effect the first illumination mode. The illumination system also includes a second diffractive optical element in the path of the radiation beam. The second diffractive element is arranged to effect the second illumination mode in combination with the first diffractive optical element. The apparatus also includes an insertion mechanism arranged to selectively position the second diffractive optical element in the path of the radiation beam, and a support structure constructed to support the patterning device. The patterning device is configured to impart the radiation beam with a pattern in its cross-section to form a patterned beam. The apparatus further includes a substrate table constructed to hold a substrate, and a projection system configured to project the patterned beam onto a target portion of the substrate. The projection system includes a plurality of optical elements and having a pupil plane, at least one of the plurality of optical elements being located in or near the pupil plane. The apparatus further includes a control system configured to control the illumination system, the support structure and the substrate table to select the first illumination mode when a pattern on the patterning device and a substrate on the substrate table are in the path of the radiation beam to perform a production exposure and to select the second illumination mode during a time that no substrate is in the path of the radiation beam to perform a corrective irradiation process.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
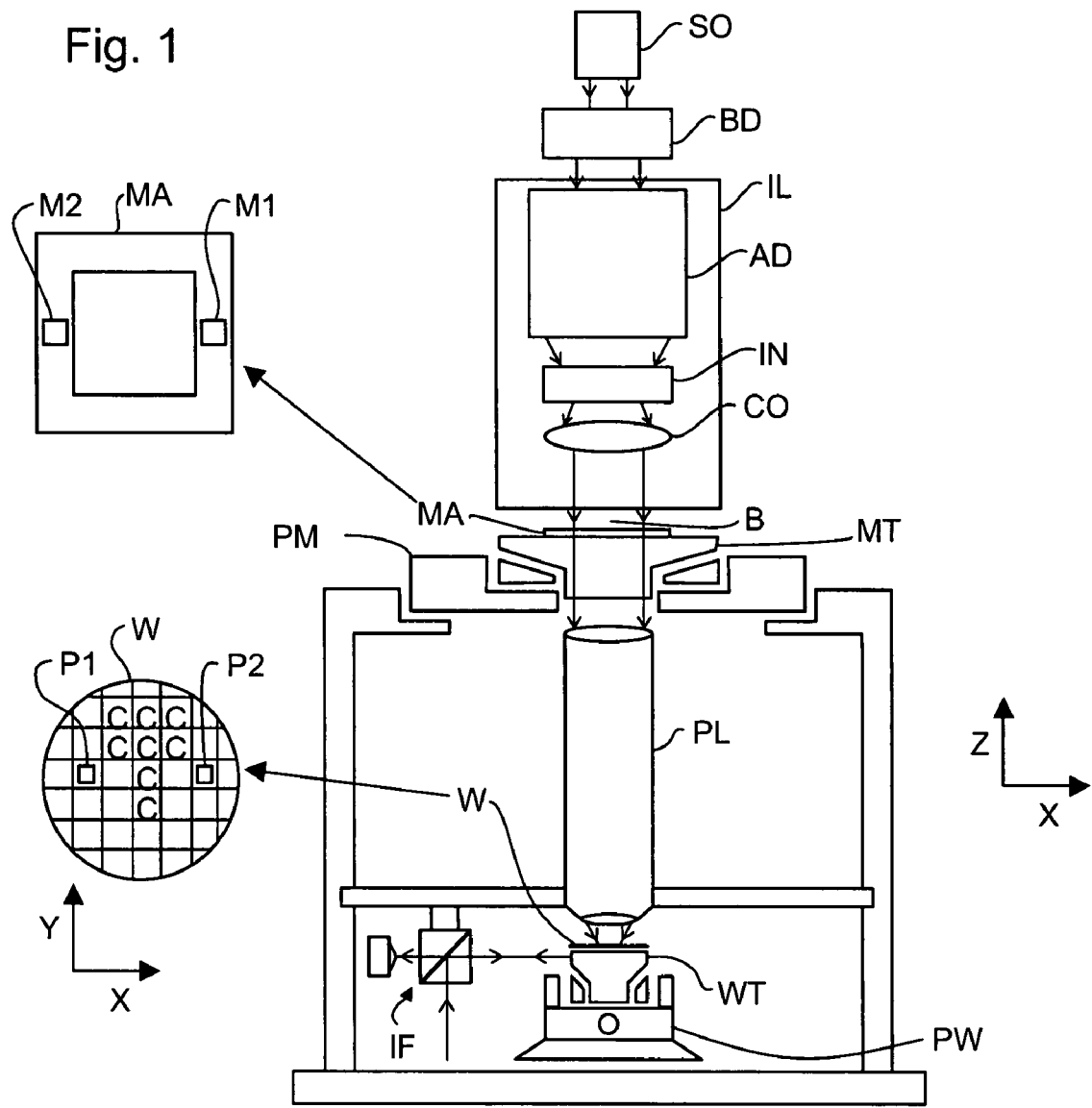
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or deep ultra violet (DUV) radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
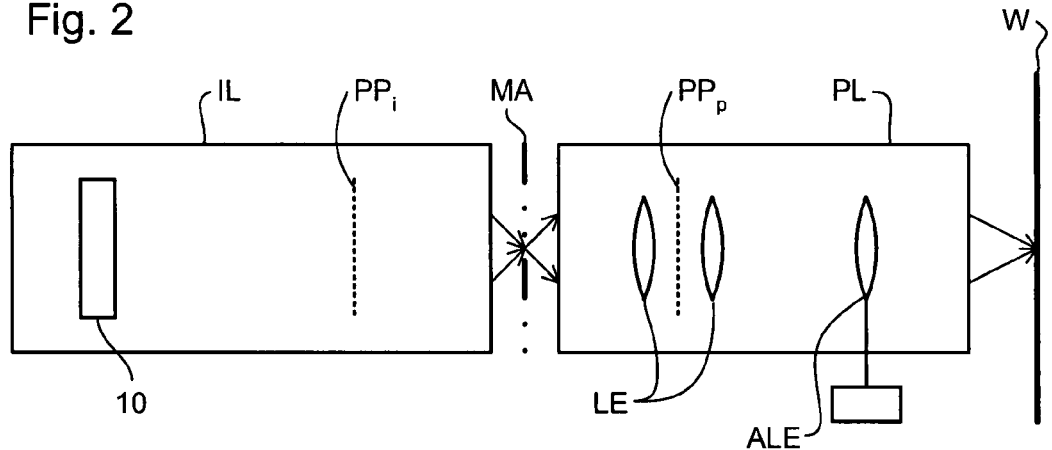
FIG. 2 depicts the optical arrangement of the apparatus of FIG. 1.

FIG. 2 depicts the basic optical arrangement of the apparatus of FIG. 1. It uses Koehler illumination wherein a pupil plane $PP_i$ in the illumination system IL is a Fourier transform plane of the object plane in which the patterning device MA is located and is conjugate to a pupil plane $PP_p$ of the projection system PL. As is conventional, an illumination mode of this apparatus can be described by reference to the distribution of intensity of the radiation of the beam B in the pupil plane $PP_i$ of the illumination system. It will be understood that the distribution of intensity in the pupil plane $PP_p$ of the projection system PL will be the same as the distribution of intensity in the pupil plane $PP_i$ of the illumination system, subject to diffraction effects of the pattern present in patterning device MA. A diffractive optical element (or other optical element) 10 is provided to form the illumination mode.

For a pattern consisting essentially of lines in one direction, good imaging and a large process window can be obtained by the use of dipole illumination in which the poles are arranged such that in the pupil plane $PP_p$ of the projection system, one of the first order diffracted beams deriving from each of the two poles in the illumination system coincides with the zeroth order beam deriving from the other pole. The other first order beams and higher order beams are not captured by the projection system.

Figure 3:
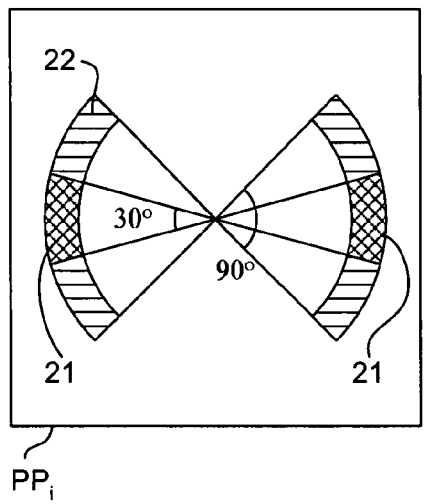
FIG. 3 depicts an illumination mode used in production exposures in a first method according to an embodiment of the invention.

A commonly used form of dipole is shown in FIG. 3. The poles 21 take the form of segments of an annulus subtending, as an example, an angle of 30°. This intensity distribution is convenient as it provides good imaging and is easy to create using a diffractive optical element and a zoom axicon. However, such an intensity distribution may give rise to aberrations caused by non-uniform heating of optical elements (e.g., lenses) LE in or adjacent to the pupil plane $PP_p$ in the projection system PL that are not correctable by a known adjustable optical element (e.g., lens) ALE. Heating effects caused by an intensity distribution comprising dipoles 22, that are again annular but subtend a larger angle, e.g. 90° (see FIG. 3), are acceptable or correctable by a known adjustable optical element ALE. In other respects however, such an intensity distribution provides inferior imaging performance as a larger proportion of the first diffraction orders fall outside the pupil, leading to lower image contrast.

Figure 4:
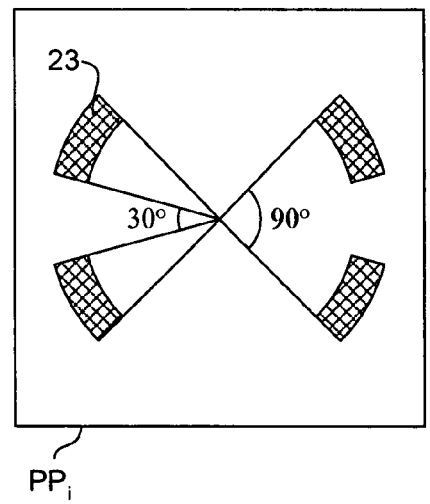
FIG. 4 depicts an illumination distribution in a corrective irradiation procedure of the first method.

Therefore, according to an embodiment of the invention, a corrective heating process is carried out using an intensity distribution for illumination as shown in FIG. 4. This distribution comprises four poles 23 which are segments of the same annulus as the pole 21 of the intensity distribution used for production exposures, and again have, for example, an opening angle of 30° but are positioned adjacent the locations of the poles 21. It is not required that the poles 23 are exactly adjacent the positions of the poles 21, a gap or some overlap may be tolerated if not too large. In some cases, the inner and outer radii (sigma settings) of the poles 23 may differ from those of poles 21 without detriment. In effect, the poles 23 correspond to the parts of the intensity distribution 22, which may give rise to a correctable optical element heating effect, that are not used in the intensity distribution selected for production exposures. The effect of irradiating the apparatus with the intensity distribution shown in FIG. 4 is that the optical elements LE that have been non-uniformly heated by production exposures are heated substantially equivalently to the heating that would be caused by use of the intensity distribution 22. That, as noted above, can result in acceptable or correctable optical element heating effects.

Figure 5:
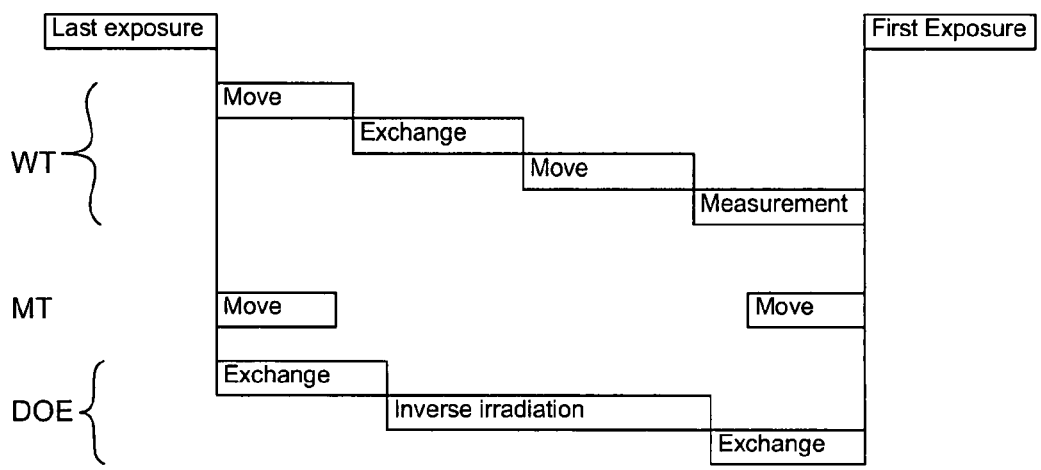
FIG. 5 depicts the timing of steps in a method according to an embodiment of the invention.

The procedure for performing the corrective irradiation process utilizing the intensity distribution shown in FIG. 4 is illustrated in FIG. 5. At the end of the last exposure for a substrate, the substrate table moves to an exchange position and the exposed substrate is exchanged for an unexposed substrate. The substrate table then moves to a measurement position at which necessary measurements, e.g. to determine the position of the substrate on the substrate table, can be performed. In a dual stage apparatus, this process is modified in that rather than exchanging substrates, the substrate table bearing the exposed substrate is exchanged for another substrate table bearing an unexposed substrate and fewer measurements need be performed as the unexposed substrate will already have been characterized and its position on its substrate table measured before the exchange.

In parallel, the support structure MT, which would normally simply be moved to the start scanning position required for the first exposure of the next substrate, is moved to a position wherein the beam B can pass unimpeded. This may be a position such that a blank part of the patterning device is positioned in the object field, a position in which an aperture in the support structure MT (e.g. one provided for a measuring process) is positioned in the object field, or a position in which the support structure MT is wholly away from the beam B path. If a completely clear path cannot be obtained, the support structure MT is desirably positioned so that a relatively clear part of the patterning device, desirably bearing relatively large scale structures, is positioned in the object field. Also, in this circumstance, it may be desirable to scan the support structure MT during the corrective irradiation procedure to avoid any problems that might be caused by localized heating of the patterning device.

Also in parallel, the intensity distribution is switched over, e.g. by exchange of diffractive optical elements, to the illumination mode to be used for the corrective irradiation procedure. Then, the corrective irradiation procedure is performed and the illumination mode reset to that required for production exposures. The corrective irradiation procedure is carried out when there is no substrate in the beam path, either because the substrate table is empty or moved out of the way of the beam or because a shutter or closing disk is used to block the beam before it reaches the position of the substrate table.

It will be seen that if the corrective irradiation procedure is not to reduce throughput the time available for performing it is limited. However, in that case the power level of the radiation source may be increased and/or any variable attenuator in the beam path may be set to maximum throughput so that the power level passing through the projection system is greater than during production exposures. For example, the power level in the projection system for the corrective irradiation may be at least 105%, at least 110%, at least 120% or at least 150% of the power level for production exposures. A higher power level is not always necessary, however, and in general, the power level of the beam during the corrective radiation procedure may be in the range from about 50% to 170% of the power level during production exposures. In view of the limited time available for the corrective irradiation procedure, limiting the area that is to be heated improves the compensation that can be achieved. It should be noted that the wavelength of the radiation used in the corrective radiation does not need to be controlled to the same precision as during production exposures so that wavelength control of a source such as a laser may be relaxed during the corrective irradiation procedure.

An alternative approach to determination of which selected parts of the pupil plane should be heated during the corrective irradiation procedure is to calculate which parts of the pupil plane are important for imaging and apply heating in the corrective irradiation procedure to the parts of the pupil plane that are important for imaging but will not be heated during actual production exposures as much as the most strongly heated parts of the pupil plane. Then, an illumination pattern effective to heat those selected parts can be derived by known software. The parts of the pupil plane that are important for imaging can be readily determined with knowledge of the illumination mode to be used and the pattern to be imaged. Many lithographic patterns, especially those involved in production of repetitive structures such as memory, consist mostly of lines extending in the horizontal and vertical directions and having a single pitch, or just a few discrete pitch values. When illuminated by an illumination mode having localized poles, such a patterning device pattern will diffract the projection beam into several localized areas of the pupil planes which accordingly are strongly heated.

However, there may be a small number of other structures in the pattern which must also be faithfully imaged. These will diffract the projection beam into other parts of the pupil plane and accordingly the corrective irradiation process can be performed to heat these other parts of the pupil plane. In other circumstances, the illumination mode and patterning device pattern may give rise to comparatively strong zeroth order beams which cause a comparatively high level of background irradiation at the substrate level and one or more relatively weak higher orders which are essential to define the necessary contrast for imaging. In this case, the corrective irradiation procedure may be arranged to heat the parts of the pupil plane occupied by the higher order diffraction beams. In general, the corrective irradiation procedure may be arranged to heat those parts of the pupil plane through which radiation required for accurate imaging passes in production exposures but which in production exposures experience a heat load less than 50%, less than 25%, less than 10% or less than 5% of the heat load experienced by areas receiving the highest heat load.

A further alternative method of determining the parts of the pupil plane to be heated in the corrective irradiation procedure is first to model the optical element heating effects of the illumination mode selected for production exposures when used in conjunction with the specific pattern. From this can be determined the phase errors that will occur. It is then possible to calculate what heating would be required to eliminate such phase errors or reduce them to a level that can be corrected to whatever adjustable optical elements are present in the projection system, taking into account whatever other corrections are required to apply.

It will be appreciated that it may not be possible in all cases to eliminate entirely aberrations induced by optical element heating, either by the method described herein or with an available adjustable optical element. Thus, in general, the corrective irradiation procedure should be arranged, in combination with an available adjustable element and subject to other constraints, to minimize pupil deformations in the part of the pupil that is significant for imaging. On the other hand, where deformations of the pupil plane can be well corrected, e.g. using a 2-dimensional pupil phase manipulator, the method described herein may be used to also minimize field variations.

Figure 6:
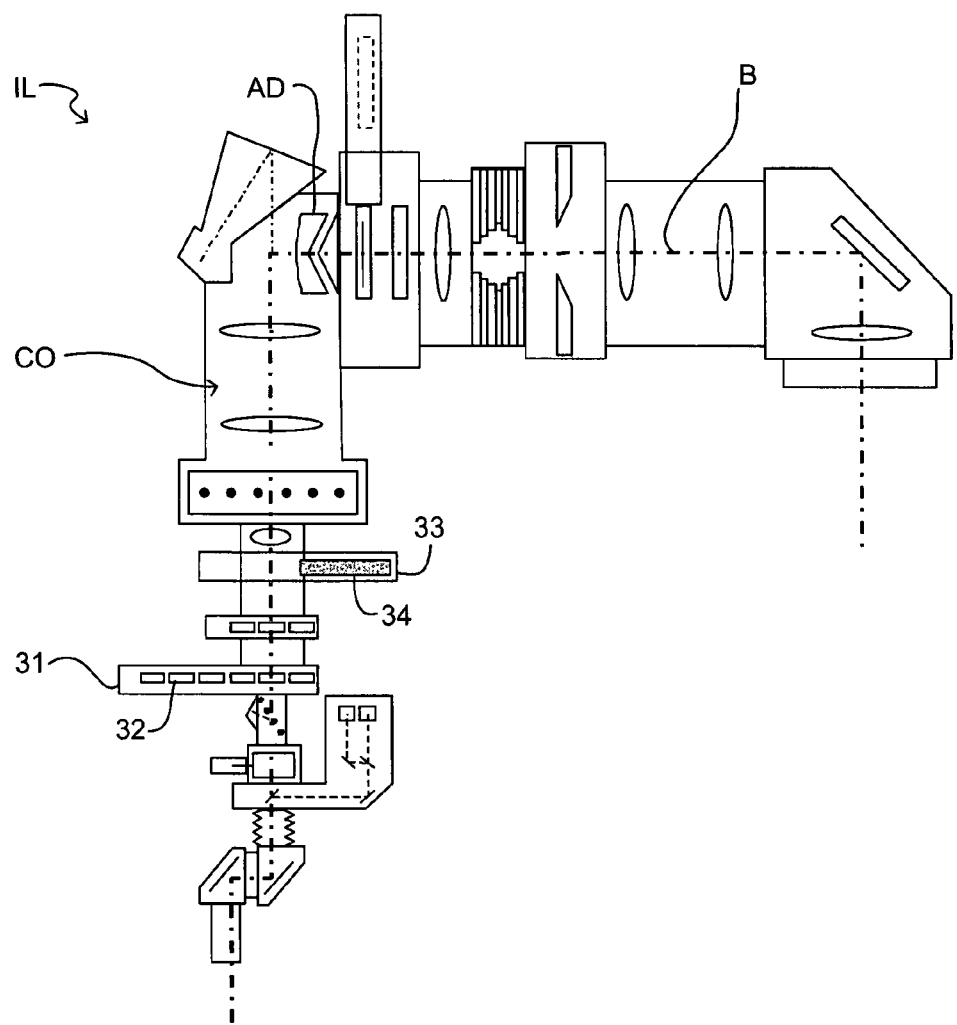
FIG. 6 depicts the illuminator in a second embodiment of the invention.
Figure 7:
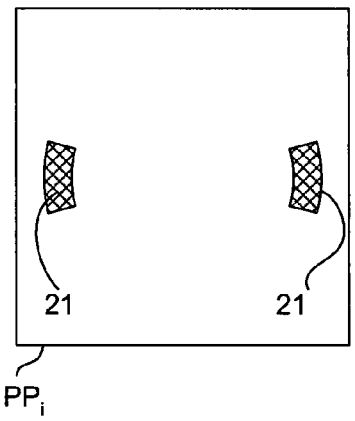
FIGS. 7 and 8 depict the radiation distributing effect of a first and second diffractive optical elements used in the second embodiment of the invention.

A second embodiment is the same as the embodiment described above, with the additional features described below. The illuminator IL of the second embodiment is shown in greater detail in FIG. 6, but only parts relevant to the embodiment are labeled and discussed. In this illuminator, exchanger 31 allows for the selective insertion of a diffractive optical element (DOE) 32, which may be chosen from a selection held in a cartridge or carousel, to form a desired illumination distribution in the pupil plane $PP_i$, such as that shown in FIG. 7. The illumination distribution shown in FIG. 7 has two poles 21, each comprising a small section of an annulus, located on an axis, e.g. the x axis and spaced apart in the x direction and is similar to the exemplary radiation distribution discussed in the first embodiment.

Figure 8:
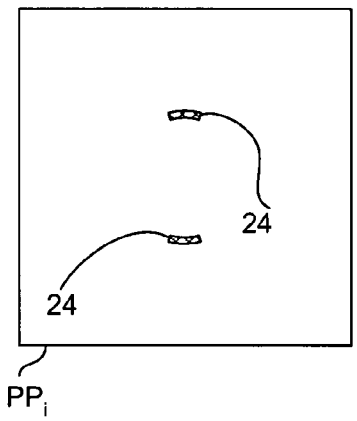
Figure 9:
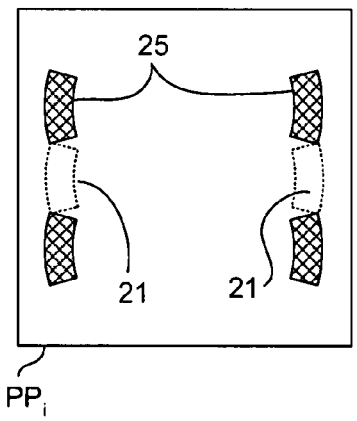
FIG. 9 depicts the combined radiation distributing effect of the first and second diffractive optical elements.

A second exchanger 33 allows the insertion of a second diffractive optical element (DOE) 34 into the beam to also affect the intensity distribution in the pupil plane $PP_i$. The exchanger 33 may be arranged to rapidly move a single diffractive optical element into and out of the beam B so that the second DOE can be selectively inserted into the beam between exposures without reducing throughput. The second DOE 34 is arranged so that, used alone, it would distribute the radiation of the projection beam B into two small areas 24 in the pupil plane $PP_i$ spaced apart from an axis, e.g. the x axis, of the pupil plane, as shown in FIG. 8. Areas 24 are shown as sections of a thin annulus but may be of any convenient shape. The second DOE 34 is not intended to be used alone, however. Rather, the second DOE 34 is designed such that the effect of using both the first and second DOEs is an intensity distribution in the pupil plane such as that depicted in FIG. 9. This distribution is the result of the convolution of the first and second DOEs and comprises four poles 25 spaced apart in the x and y directions so that they are located adjacent the positions of the poles 21 of the intensity distribution effected by the first DOE alone and shown in FIG. 7. The positions of poles 21 are shown in phantom in FIG. 9 for illustrative purposes but when both DOEs are used together there is not significant radiation in this region.

The four poles 25 produced by the combination of the first and second DOEs are therefore similar to those used for the corrective irradiation process of the first embodiment. Thus, in the second embodiment the corrective irradiation process can be performed by moving the second DOE 34 into the beam rather than exchanging the first DOE 32 for a different DOE to effect the distribution required for the corrective irradiation process. Since the second exchanger can be designed for maximum speed in moving the second DOE into and out of the beam, rather than to hold and exchange multiple DOEs, switching between the normal exposure intensity distribution and the corrective intensity distribution can be achieved more quickly, allowing more time for the corrective irradiation process.

The second diffractive optical element may be specially designed to form, in combination with a particular first diffractive optical element, the desired intensity distribution for the corrective irradiation process, or one second diffractive optical element may be effective to form the required intensity distribution for the corrective irradiation process when used with several different first diffractive optical elements that form respective intensity distributions.

For example, exchanger 31 may be provided with two first diffractive optical elements 32, a dipole-x DOE to form dipole-x illumination (i.e. an illumination distribution with two poles spaced apart in the x-direction) and a dipole-y DOE to form dipole-y illumination (i.e. an illumination distribution with two poles spaced apart in the y-direction). At the position of the second element 33, there are three areas in the cross-section of the beam B. The first area is illuminated only with dipole-x radiation, the second only by dipole-y radiation and the third by both dipole-x and dipole-y radiation. A second DOE may be constructed so that the first area is similar to a dipole-y DOE, the second to a dipole-x DOE and the third to a quadrupole DOE. Such a second DOE will form appropriate illumination modes for the corrective irradiation procedure when used with either a dipole-x DOE or a dipole-y DOE.

According to an embodiment of the invention, there is provided a lithographic apparatus wherein optical element 10 of the illumination system IL, as depicted in FIG. 2, includes a setting device configured to direct different parts of an incoming radiation beam into different directions to provide a desired spatial intensity distribution of the projection beam at the pupil plane PPi and a corresponding desired angular intensity distribution of the projection beam at the patterning device MA, the setting device including a plurality of directing elements, each directing element configured to direct a corresponding part of the incoming beam, and an orientation of each directing element is set to direct the corresponding part of the beam into a desired direction.

For example, the setting device may be embodied as a micro-electromechanical or micro-opto-electro-mechanical system comprising an array of mirrors wherein each of the mirrors can be tilted in two different planes perpendicular to each other. Radiation incident on such devices can be reflected into (substantially) any desired direction of a hemisphere or of a portion of a hemisphere. A controller may be provided to control the positional orientation of each of the mirrors. By controlling the positional orientations of the reflective elements, almost any spatial intensity distribution in the pupil plane PPi can be produced. The setting device may be, for example, a transmissive or reflective LCD wherein the orientation (e.g., state or position) of the LCD pixels can be changed to configure the intensity distribution.

In particular, according to an aspect of the invention, a switching of intensity distribution in the pupil PPi, between an intensity distribution to perform a corrective irradiation process and an intensity distribution for use with die exposure, is obtained by a corresponding switching of orientations of a plurality of mirrors of the aforementioned array of mirrors or of a plurality of pixels of the aforementioned LCD. More information on mirror arrays and their use for providing illumination modes (i.e., spatial intensity distributions in the pupil plane PPi) can be gleaned, for example, from United States patent application publication no. US 2004-0108467 and U.S. Pat. No. 6,031,946, each of which is incorporated herein in its entirety by reference. More information on a LCD setting device or similar arrangements can be gleaned, for example, United States patent application publication no. US 2007-0013888, which is incorporated herein in its entirety by reference.

As discussed herein, "in use of the apparatus" means any usage of the lithographic apparatus as appropriate. For example, use of the apparatus may be illumination in the lithographic apparatus with the patterning device in the path of the illumination (e.g., substrate exposure to a device pattern) and/or illumination without the patterning device in the path of the illumination (e.g., corrective irradiation as described herein) as appropriate for the situation. For example, "use of the apparatus" may include illumination in the lithographic apparatus using a first illumination mode with the patterning device in the path of the illumination and illumination in the lithographic apparatus using a second illumination mode without the patterning device in the path of the illumination.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
an illumination system configured to condition a radiation beam so as to illuminate a patterning device in a first or a second illumination mode selectively;
a support structure constructed to support the patterning device, the patterning device configured to impart the radiation beam with a pattern in its cross-section to form a patterned beam;
a substrate table constructed to hold a substrate;
a projection system configured to project the patterned beam onto a target portion of the substrate, the projection system comprising a plurality of optical elements and having a pupil plane, at least one of the optical elements being located in or near the pupil plane; and
a control system configured to control the illumination system, the support structure and the substrate table to select the first illumination mode when a pattern on the patterning device and a substrate on the substrate table are in the path of the radiation beam to perform a production exposure and to select the second illumination mode during a time that no substrate is in the path of the radiation beam to perform a corrective irradiation process,
wherein, in the first illumination mode, an angular distribution of radiation at the patterning device is such that an intensity of the patterned beam is substantially contained within a first part of the cross-sectional area of the at least one optical element and within a second part of the cross-sectional area of the at least one optical element in the second illumination mode, the first and second parts being substantially non-overlapping and the combination of the first and second parts not encompassing the entire cross-sectional area of the at least one optical element,
wherein elements of the lithographic apparatus are constructed and arranged such that an intensity distribution of the patterned beam in the second illumination mode results in an optical element heating effect that causes the at least one optical element that is non-uniformly heated in the first illumination mode to be heated substantially uniformly thereby correcting any optical aberrations caused by the non-uniform heating.

2. The apparatus of claim 1, wherein the lithographic apparatus includes an exchange mechanism to selectively position a first diffractive optical element or a second diffractive optical element in the path of the radiation beam to effect the first or second illumination modes respectively.

3. The apparatus of claim 1, wherein the lithographic apparatus includes a first diffractive optical element in the path of the radiation beam, the first diffractive optical element being arranged to effect the first illumination mode, and an insertion mechanism arranged to selectively position a second diffractive optical element in the path of the radiation beam, the second diffractive element being arranged to effect the second illumination mode in combination with the first diffractive optical element.

4. The apparatus of claim 3 wherein the lithographic apparatus includes an exchange mechanism arranged to selectively insert into the path of the radiation beam one of a plurality of first diffractive optical elements, each first diffractive optical element being arranged to effect a different first illumination mode and wherein the second diffractive element is arranged to effect the second illumination mode in combination with any one of the first diffractive optical elements.

5. The apparatus of claim 1, wherein the control system is further configured to control a radiation source to emit the radiation beam at a first power level or a second power level respectively when the first or second illumination modes is selected, the second power level being higher than the first power level.

6. The apparatus of claim 1, wherein the second part is arranged so that the corrective irradiation procedure is effective to reduce aberrations caused by non-uniform heating in the production exposure of the at least one optical element.

7. The apparatus of claim 1, wherein first illumination mode is characterized by a dipole radiation distribution and the second illumination mode is characterized by a quadrupole radiation distribution having poles adjacent the locations of the poles of the first illumination mode.

8. The apparatus of claim 7, wherein the poles of the dipole distribution are segments of an annulus and the poles of the quadrupole distribution are segments of the same annulus.

9. The apparatus of claim 1, wherein the combination of the first and second illumination modes would be such as to give rise to a heating effect in the projection system that does not cause aberrations in the projected patterned beam that are unacceptable.

10. The apparatus of claim 1, wherein the projection system further comprises an adjustable optical element configured to correct an aberration in the projected patterned beam and wherein the combination of the first and second illumination modes would be such as to give rise to a heating effect in the projection system that causes aberrations that are correctable by the adjustable optical element.

11. The apparatus of claim 1, comprising a setting device configured to direct different parts of the radiation beam prior to the patterning device into different directions to provide a desired intensity distribution of the radiation beam, the setting device including a plurality of directing elements, each directing element configured to be oriented to direct a corresponding part of the radiation beam into a desired direction.

12. A lithographic apparatus comprising:
  an illumination system configured to condition a radiation beam so as to illuminate a patterning device in a first or a second illumination mode selectively, the illumination system comprising
  a first diffractive optical element in the path of the radiation beam, the first diffractive optical element being arranged to effect the first illumination mode, and a second diffractive optical element in the path of the radiation beam, the second diffractive element being arranged to effect the second illumination mode in combination with the first diffractive optical element,
  an insertion mechanism arranged to selectively position the second diffractive optical element in the path of the radiation beam;
  a support structure constructed to support the patterning device, the patterning device configured to impart the radiation beam with a pattern in its cross-section to form a patterned beam;
  a substrate table constructed to hold a substrate;
  a projection system configured to project the patterned beam onto a target portion of the substrate, the projection system comprising a plurality of optical elements and having a pupil plane, at least one of the plurality of optical elements being located in or near the pupil plane; and
  a control system configured to control the illumination system, the support structure and the substrate table to select the first illumination mode when a pattern on the patterning device and a substrate on the substrate table are in the path of the radiation beam to perform a production exposure and to select the second illumination mode during a time that no substrate is in the path of the radiation beam to perform a corrective irradiation process.

13. The lithographic apparatus according to claim 12, wherein the first diffractive optical element is configured to form an illumination distribution in the pupil plane, and the second diffractive optical element is configured to affect intensity distribution in the pupil plane.

14. The lithographic apparatus of claim 12, wherein, in the first illumination mode, an angular distribution of radiation at the patterning device is such that an intensity of the patterned beam is substantially contained within a first part of the cross-sectional area of the at least one optical element and within a second part of the cross-sectional area of the at least one optical element in the second illumination mode, the first and second parts being substantially non-overlapping and the combination of the first and second parts not encompassing the entire cross-sectional area of the at least one optical element.

\* \* \* \* \*